(12) United States Patent
Galera et al.

(10) Patent No.: US 7,944,031 B2
(45) Date of Patent: May 17, 2011

(54) LEADFRAME-BASED CHIP SCALE SEMICONDUCTOR PACKAGES

(75) Inventors: Manolito Galera, Etobicoke (CA); Leocadio Morona Alabin, Singapore (SG)

(73) Assignee: Fairchild Semiconductor Corporation CA (US)

( * ) Notice: Subject to any disclaimer, the term of this patent is extended or adjusted under 35 U.S.C. 154(b) by 207 days.

(21) Appl. No.: 12/277,068

(22) Filed: Nov. 24, 2008

(65) Prior Publication Data

US 2010/0127365 A1    May 27, 2010

(51) Int. Cl.
*H01L 23/495* (2006.01)

(52) U.S. Cl. ........ 257/670; 257/666; 257/672; 257/723; 257/724; 257/E23.031; 257/E23.037; 257/E23.043; 257/E23.046; 438/123

(58) Field of Classification Search .......... 257/666–677, 257/E23.031–E23.059, 679, 723, 724, 734, 257/735, 773, 776, 786; 438/123, FOR. 366, 438/FOR. 367, FOR. 377, FOR. 380
See application file for complete search history.

(56) References Cited

U.S. PATENT DOCUMENTS

2008/0272472 A1 * 11/2008 Hata et al. .................... 257/678

OTHER PUBLICATIONS

ROHM GMD2 Product Brochure, www.rohm.com/ad/gmd2/, (last accessed Mar. 16, 2009).

* cited by examiner

*Primary Examiner* — Jasmine J Clark
(74) *Attorney, Agent, or Firm* — Kirton & McConkie; Kenneth E. Horton

(57) ABSTRACT

Chip scale semiconductor packages and methods for making and using the same are described. The chip scale semiconductor packages comprise a leadframe supporting a die that contains a discrete device. The chip scale semiconductor device also contains and an interconnect structure that also serves as a land for the package. The leadframe contains a topset feature adjacent a die attach pad supporting the die, a configuration which provides a connection to the interconnect structure as well as the backside of the die. This leadframe configuration provides a maximum die size to be used in the chip scale semiconductor packages while allowing them to be used in low power and ultra-portable electronic devices. Other embodiments are described.

25 Claims, 6 Drawing Sheets

US 7,944,031 B2

LEADFRAME-BASED CHIP SCALE SEMICONDUCTOR PACKAGES

FIELD

This application relates generally to semiconductor devices and methods for making such devices. More specifically, this application describes chip scale semiconductor packages and methods for making and using such packages.

BACKGROUND

Semiconductor packages are well known in the art. Often, these packages may include one or more semiconductor devices, such as an integrated circuit ("IC") die or chip, which may be connected to a die pad that is centrally formed in a lead frame which contain a series of leads. In some cases, bond wires electrically connect the IC die to a series of terminals that serve as an electrical connection to an external device, such as a printed circuit board ("PCB"). An encapsulating material can be used to cover the bond wires, the IC die, the terminals, and/or other components of the semiconductor device to form the exterior of the semiconductor package. A portion of the terminals and possibly a portion of the die pad may be externally exposed from the encapsulating material. In this manner, the die may be protected from environmental hazards—such as moisture, contaminants, corrosion, and mechanical shock—while being electrically and mechanically connected to an intended device that is external to the semiconductor package.

After it has been formed, the semiconductor package is often used in an ever growing variety of electronic applications, such as disk drives, USB controllers, portable computer devices, cellular phones, and so forth. Depending on the die and the electronic application, the semiconductor package may be highly miniaturized and may need to be as small as possible.

SUMMARY

This application relates to chip scale semiconductor packages and methods for making and using the same. The chip scale semiconductor packages comprise a leadframe supporting a die that contains a discrete device. The chip scale semiconductor device also contains an interconnect structure that also serves as a land for the package. The leadframe contains a topset feature adjacent a die attach pad supporting the die, a configuration which provides a connection to the interconnect structure as well as the backside of the die. This leadframe configuration provides a maximum die size to be used in the chip scale semiconductor packages while allowing them to be used in low power and ultra-portable electronic devices.

BRIEF DESCRIPTION OF THE DRAWINGS

The following description can be better understood in light of the Figures, in which.

Figure 1:
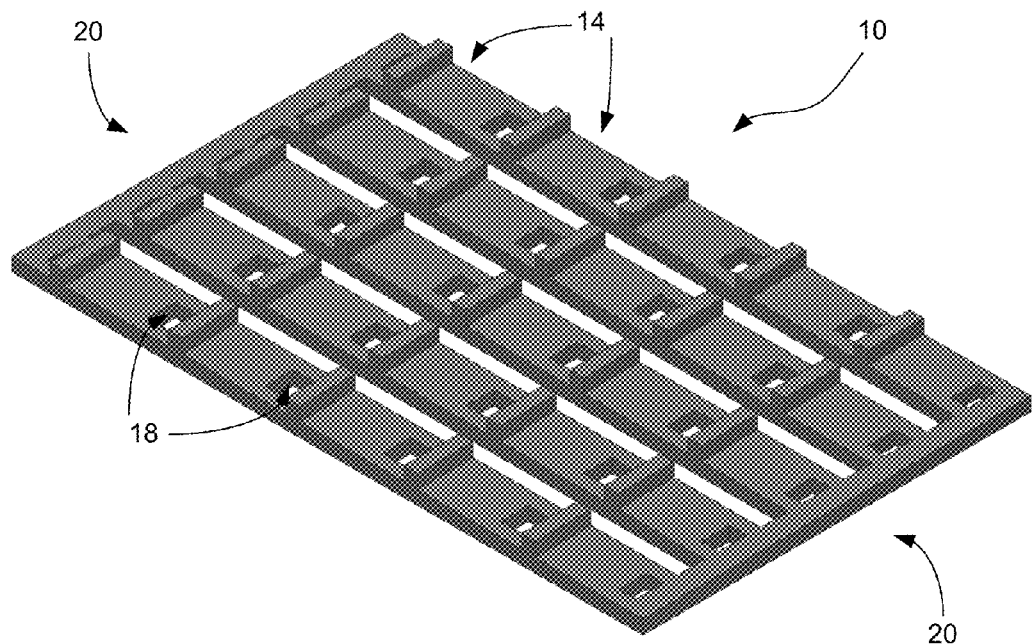
FIG. 1 shows some embodiments of a leadframe that can be used in a method for making the semiconductor packages.

The Figures illustrate specific aspects of the semiconductor packages and methods for making such packages. Together with the following description, the Figures demonstrate and explain the principles of the methods and structures produced through these methods. In the drawings, the thickness of layers and regions are exaggerated for clarity. It will also be understood that when a layer, component, or substrate is referred to as being "on" another layer, component, or substrate, it can be directly on the other layer, component, or substrate, or intervening layers may also be present. The same reference numerals in different drawings represent the same element, and thus their descriptions will not be repeated.

DETAILED DESCRIPTION

The following description supplies specific details in order to provide a thorough understanding. Nevertheless, the skilled artisan would understand that the semiconductor packages and associated methods of making and using the packages can be implemented and used without employing these specific details. Indeed, the semiconductor packages and associated methods can be placed into practice by modifying the illustrated devices and methods and can be used in conjunction with any other apparatus and techniques conventionally used in the industry. For example, while the description below focuses on methods for making chip scale semiconductor packages in the IC industry, it could be used for packaging for other electronic devices like optoelectronic devices, solar cells, MEMS structures, lighting controls, power supplies, and amplifiers.

Some embodiments of the chip scale semiconductor packages (CSPs) and methods for making and using such semiconductor packages are shown in FIGS. 1-12. In these embodiments, the methods for making the semiconductor packages begin by providing a leadframe 10. The leadframe supports a die that will be placed thereon, serves as part of the input/output (I/O) interconnection system, and also provides a thermally conductive path for dissipating some of the heat generated during operation. The material of the leadframe can comprise any conductive metal or metal alloy known in the art, including Cu, Ni—Pd, Fe, Fe alloy, Ni—Pd—Au, Ni—Pd—Au/Ag, or combinations thereof. In some embodiments, the leadframe comprises Cu or Ni—Pd—Au.

In some instances, the leadframe 10 can contain a layer of metal plating (not shown) if desired. For example, the leadframe 10 may be electroplated or otherwise coated with a layer of a solderable conductive material, such as tin, gold, lead, silver, and/or another solderable material. In some embodiments, the leadframe 10 can have one or more recesses that define a die pad (or die attach pad). For example, as shown in FIG. 1, the leadframe 10 contains an upper surface with a recess that operates as a die attach pad 12 and which is sized and shaped to allow a semiconductor die to be disposed thereon.

FIG. 1 depicts some embodiments where the leadframe 10 contains a plurality of individual panels 14 that are encompassed within a frame 20. Each panel 14 can be separated from the adjacent panels and the frame 20 (as described herein) and used in an individual semiconductor package. Thus, each leadframe 10 can be used to make any desired number of semiconductor packages, subject to limitations of the processing equipment being used. Each panel 14 contains a die attach pad (or DAP) 12 that can support a semiconductor die which is placed thereon.

Figure 2:
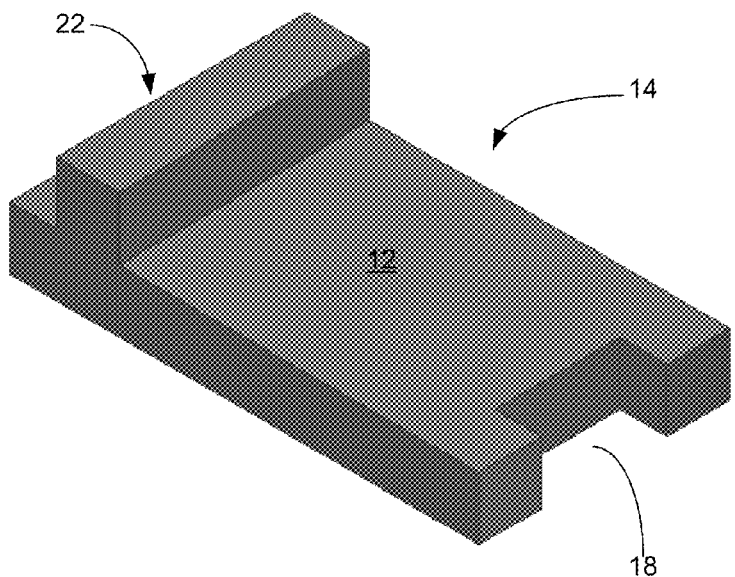
FIG. 2 depicts some embodiments of a standoff feature that can be part of the leadframe.

The leadframe 10 for the semiconductor package can be provided by any process known in the art. The leadframe 10 can be made by, for example, by metal stamping or etching. In some embodiments, the leadframe 10 can be made by an etching process that provides each panel 14 with an etched portion 18 near one end of the individual panel, as shown in FIG. 2. The etched portion 18 operates as a mold-locking feature of the package, and the reduced metal area improves blade life during saw singulation. In the embodiments shown in the Figures, the edge of the panel 14 is etched so about half of that edge is removed. But in other embodiments, the etching could remove anywhere from about 40 to about 75% of that edge.

Each panel 14 can also be provided with a topset feature that will be used both as a standoff and as a contact for a discrete device in the die that is located on the DAP of the panel. In some embodiments, the topset feature remains in the leadframe after the etching process that is used to make the leadframe. The height of the topset feature is substantially the same as the height of the leadframe that is etched. In some embodiments, the topset feature comprises a standoff 22 as depicted in FIG. 2. A close-up of this topset feature shows that the standoff 22 extends from the side of the leadframe 10 in a vertical direction. The standoff can have any length and width consistent with these functions. In some embodiments, the standoff can have a length of about 20 mils and a width of about 10 mils. The height added by the standoff 22 (relative to the rest of the leadframe 10) depends on the thickness of the dies (that will be located on the DAP) since the upper surface of the standoff 22 will be substantially planar with the upper surface of the dies.

Figure 3:
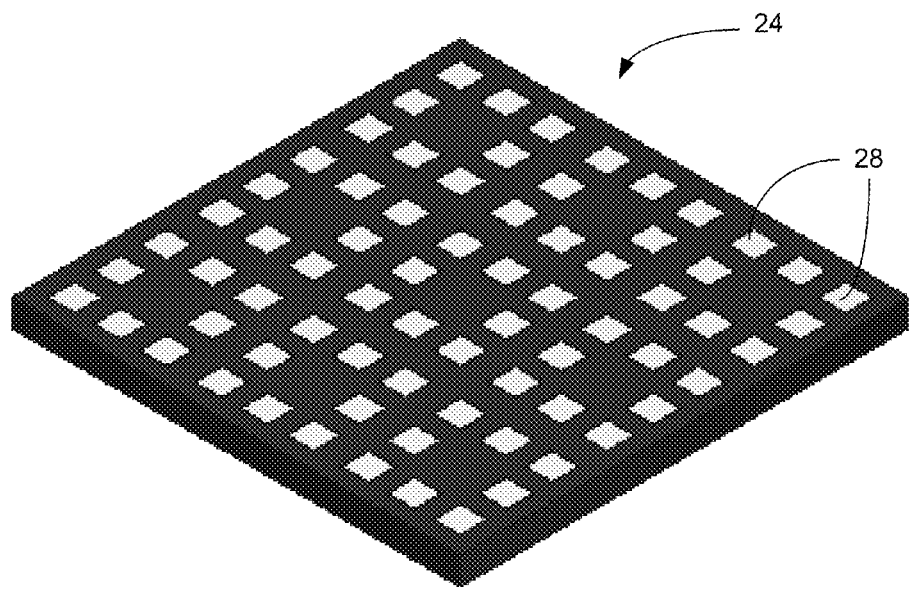
FIG. 3 illustrates some embodiments of a semiconductor wafer containing discrete devices formed therein.

The process continues when, as shown in FIG. 3, a semiconductor wafer (or substrate) 24 can be provided. The wafer 24 contains any number and combination of discrete devices. The wafer 24 may be made of any suitable semiconductor material. Some non-limiting examples of semiconductor materials include silicon, gallium arsenide, silicon carbide, gallium nitride, silicon and germanium, and the like.

In some embodiments, the wafer 24 can contain any number of discrete devices 28. Any discrete device known in the art can be used, including diodes and/or transistors. Examples of the discrete devices include rectifiers, zener diodes, schottky diodes, transient-voltage suppressor (TVS) diodes, small signal switching diodes, bipolar junction transistors ("BJT"), metal-oxide-semiconductor field-effect transistors ("MOSFET"), insulated-gate-bipolar transistors ("IGBT"), insulated-gate field-effect transistors ("IGFET"), or combinations thereof. In some embodiments, the wafer 24 contains switching diodes.

In some embodiments, the semiconductor wafer 24 can then be provided with an array of bond pads over the desired locations of the wafer 24. In some embodiments, the bond pads can be provided in those areas that overlay the discrete devices 28. The bond pads can be formed in the desired location by any process known in the art, including any known wafer fabrication process such photolithography, etching, and deposition processes. The bond pads can be made of any known solderable material, including Ti, Ni, Ag, Au, Cu, Sn, W, or combinations thereof.

The process continues when the wafer 24 is separated into individual dies. Each die contains one or more of the discrete devices 28. This separation process can be performed using any singulation process known in the art, including any known wafer sawing process.

Figure 4:
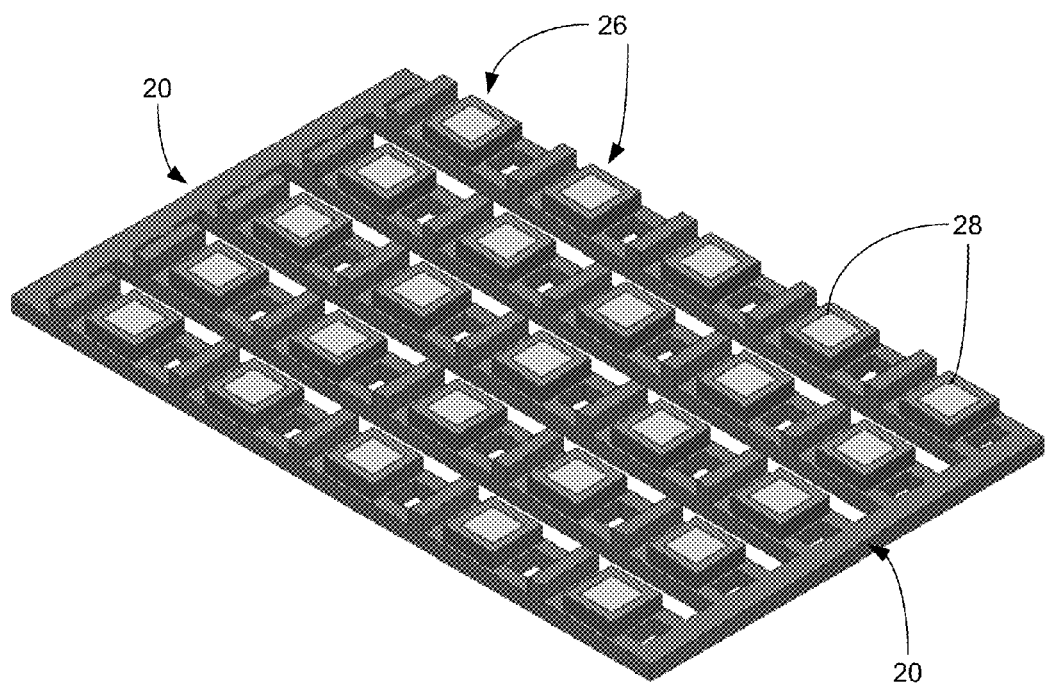
FIG. 4 shows some embodiments of a method for making semiconductor packages where discrete devices have been attached to the leadframe.

Each of the dies 26 containing the discrete device(s) 28 can then be placed on the leadframe 10, as shown in FIG. 4. The dies can be placed so that the discrete device 28 in each die (which optionally contains a bond pad) is located on an upper surface. The die 26 can be placed on the DAP in each panel 14 of the leadframe 10. Any process known in the art, such as one using a pick and place system, can be used in this procedure.

Figure 5:
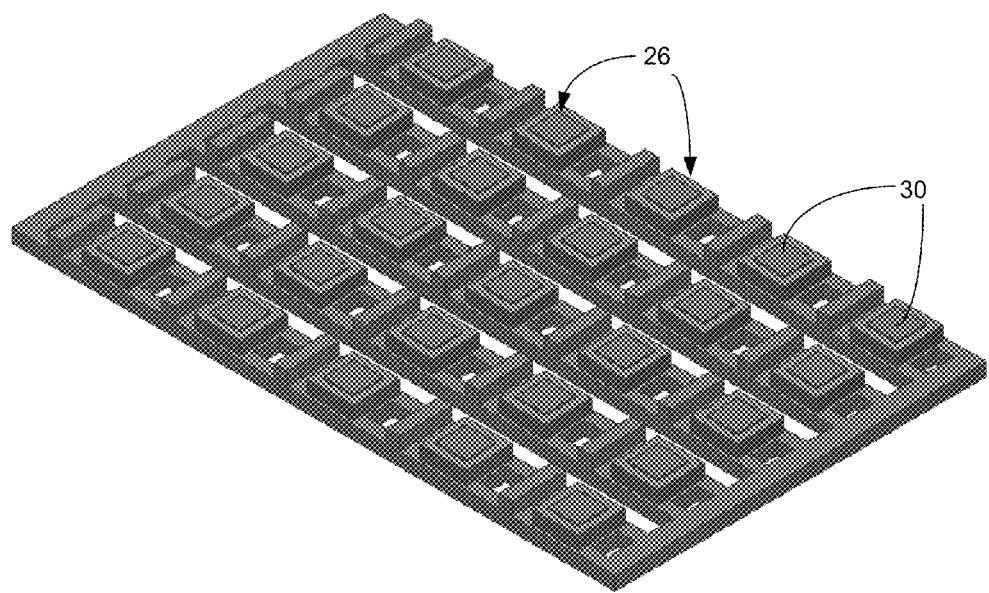
FIG. 5 shows some embodiments of a method for making semiconductor packages where an adhesive has been deposited on the discrete devices.

As shown in FIG. 5, a conductive paste 30 can then be provided on the discrete device 28 (or the bond pads). The conductive paste 30 can be made of any solderable conductive adhesive material, including Sn, Pb, Ag, Sb, Cu, Au, or combinations thereof. The conductive paste 30 can be provided on the discrete device (or the bond pads) through any process known in the art, including dispensing or any screen printing process known in the art.

Figure 6:
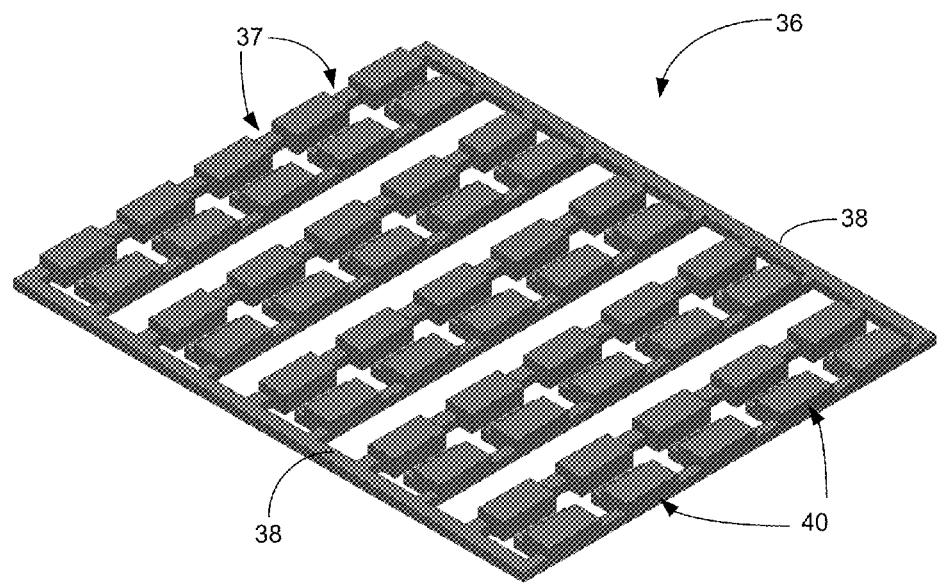
FIG. 6 shows an interconnect structure that can be used in some embodiments of a method for making semiconductor packages.

Next, an interconnect structure 36 can be provided, as shown in FIG. 6. In some embodiments, the interconnect structure 36 can be provided at any time prior to this step of the manufacturing process. The interconnect structure 36 contains a frame 38 and tie bars 37 that connect a number of connector structures 40 together. The interconnect structure 36 will contain an equivalent number of connector structures 40 as the leadframe panels 14 and will have a layout that substantially matches the layout of the conductive paste 30 on the discrete devices 28. The connector structures 40 that can be used include those made from the same material as the interconnector structure, including Cu, Ni—Pd, Ni—Pd—Au, Ni—Pd—Au/Ag, Fe, Fe alloy, or combinations thereof.

The interconnect structure 36 that can also serve as a land pad (or land) for the chip scale semiconductor package. Thus, the upper surface of the connector structures 40 will remain exposed from the semiconductor package when it is complete. Accordingly, the layout of these upper surfaces will be configured to substantially match the desired land pattern for the final chip scale semiconductor packages.

Figure 7:
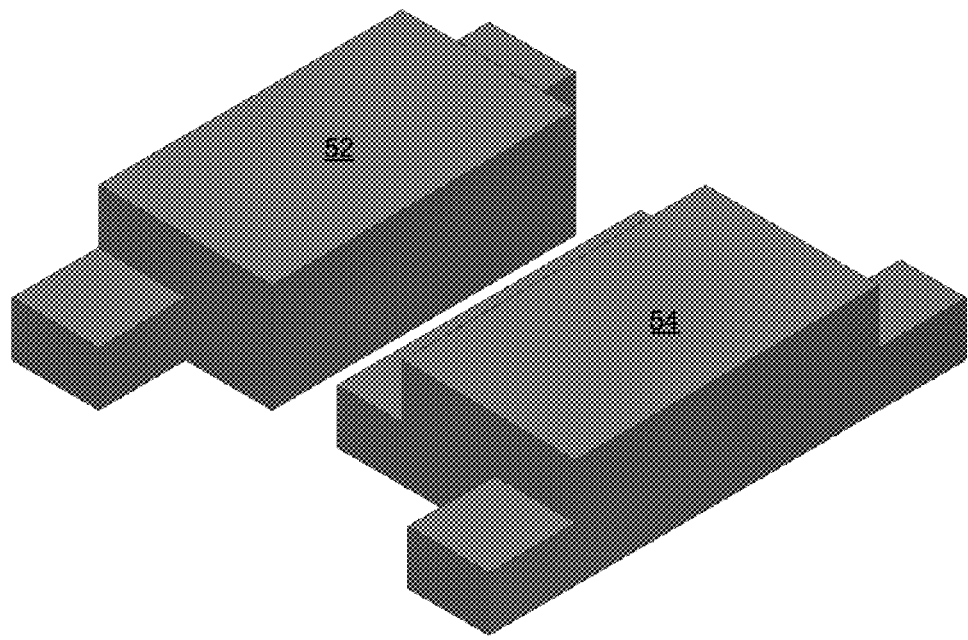
FIGS. 7-8 show some embodiments of the connector structures that can be contained in the interconnect structure.
Figure 8:
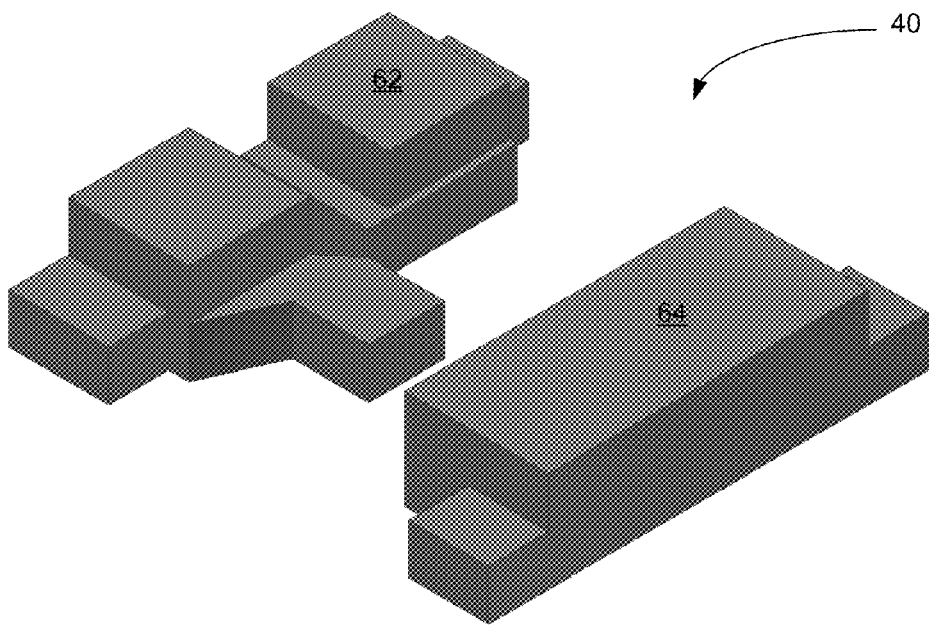

The configuration of the interconnect structure 36 is also designed to maximize the contact between the bottom of the connector structure 40 and the underlying discrete device 28. An example of how to maximize this contact is illustrated in FIGS. 7 and 8. In FIG. 7, the connector structure 40 contains both a cathode portion 52 and an anode portion 54. The cathode portion 52 has been configured with a maximum footprint on a bottom surface. And the anode portion is also configured to maximize the contact between it and the underlying discrete device. Where the connector structure 40 comprises 3 terminals for connection to a 3-terminal discrete device or bipolar transistor applications, as shown in FIG. 8, the collector 64 and emitter/base 62 can be configured to also maximize the contact. The emitter/base 62 contains a re-routed design to meet the both the underlying bond pad layout and the overlying land pattern layout.

Figure 9:
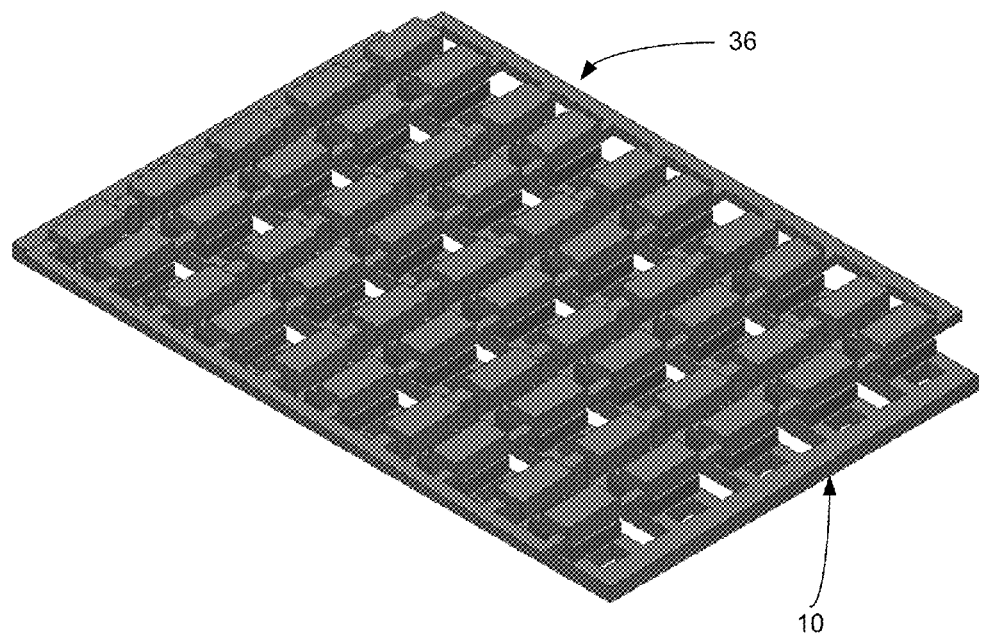
FIG. 9 shows some embodiments of a method for making semiconductor packages where the interconnect structure has been placed on the adhesive.

Next, as shown in FIG. 9, the interconnect structure 36 can be attached to the bond pads on the discrete devices 28 using any process known in the art. In this process, the material of the interconnect structure 36 connects to the bond pads via the conductive paste 30. In some embodiments, the alignment between the interconnect structure 36 and the leadframe 10 can be controlled during this process by using a pick & place procedure.

Figure 10:
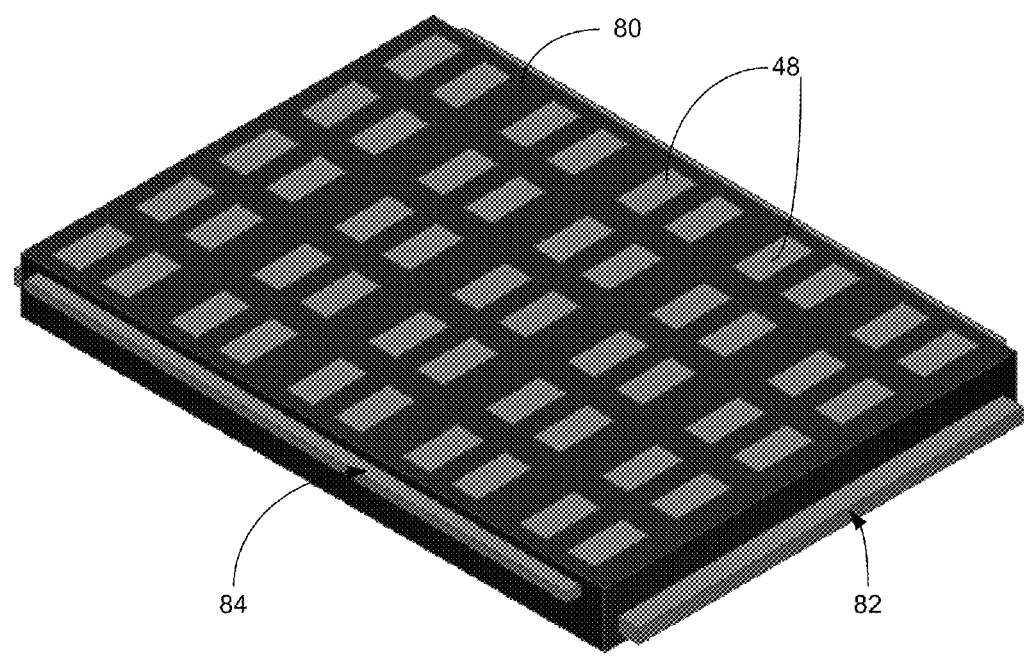
FIG. 10 shows some embodiments of a method for making semiconductor packages where a molding procedure has been performed.

The resulting structure can then be encapsulated in any molding material 80 known in the art, as shown in FIG. 10. In some embodiments, the molding material 80 can comprise an epoxy molding compound, a thermoset resin, a thermoplastic material, or potting material. In other embodiments, the molding material can comprise an epoxy molding compound. The molding material 80 may be formed using any encapsulation process known in the art, including transfer molding.

As depicted in FIG. 10, the molding material 80 does not encapsulate the upper surface of the interconnect structure 36. Thus, the exposed surfaces form an array of land pads or lands 48. The lands 48 can have any configuration or layout known in the art consistent with their operation in the semiconductor package. Thus, in the illustrated embodiments, the lands 48 are given a substantially rectangular configuration with a size of about 0.125 mm$^2$. In the illustrated embodiments (where the discrete device 28 comprises a diode with a cathode and an anode), the cathode and anode are separated by about 0.200 mm$^2$. Where the discrete device comprises a bipolar transistor, the layout can be configured to accommodate the design of the base, emitter and collector. The encapsulation process also leaves part of the frame 82 of the leadframe 10 and the frame 84 of the interconnect structure 36 exposed, as shown in FIG. 10.

Figure 11:
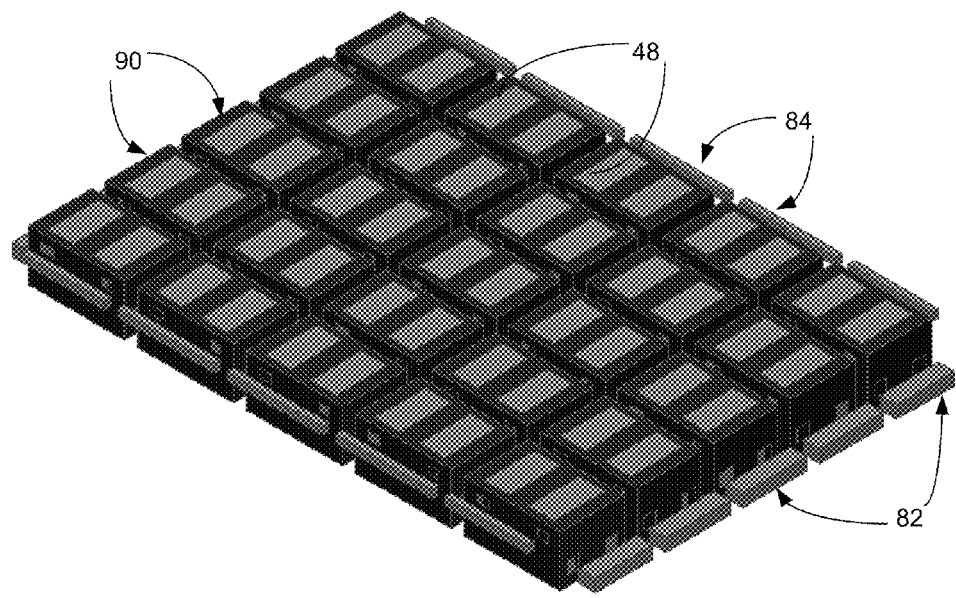
FIG. 11 shows some embodiments of a method for making semiconductor packages where a singulation procedure has been performed.

The molded structure shown in FIG. 10 can optionally be plated with Sn or SnPb. Next, as shown in FIG. 11, the molded structure is separated into individual chip scale semiconductor packages 90. The separation can be performed using any singulation process known in the art, including a saw singulation process.

Figure 12:
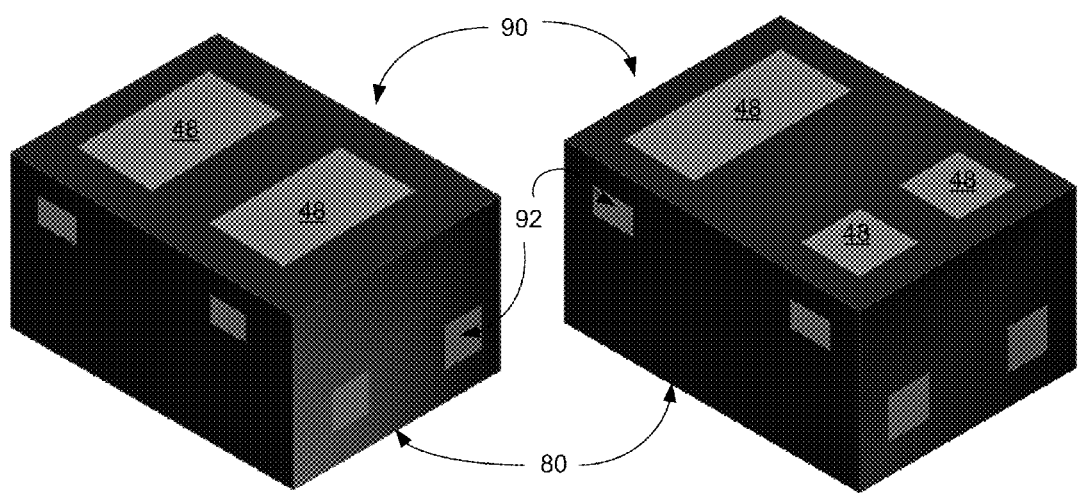
FIG. 12 shows some embodiments of a method for making semiconductor packages where the semiconductor packages have been tested and marked.

Next, as shown in FIG. 12, the individual semiconductor packages can be electrically tested and marked using any processes known in the art. The CSP 90 contains land pads 48 (or lands) that are exposed on the upper surface of the package. The CSP 90 also contains exposed metal 92 on the sides of the package that results from singulation process since these portions are connected to the tie bar and hold the leadframe and interconnect panel together during the manufacturing process. The exposed lands 48 on the upper surface of the CSP 90 can be connected to an external device, such as a PCB, using any procedure known in the art. The lands 48 will accommodate a good solder fillet formation with the PCB. Together with the PCB, the CSP can be part of any electronic device known in the art.

The CSP 90 that is manufactured contains a substantially flat array of land pads. When compared to solder balls that are typically used, this feature is more robust in terms of both mechanical stress and board mounting stress. As well, this feature provides a better test contact and flexibility for the pins and probes (like cantilever type contact fingers or spring loaded test pins) used to test the CSP because of the flat land surface of the package.

The methods described above also provide several features to the CSP. First, by using an array of flat lands, the CSP can be manufactured thinner than those that use solder balls or bumps. Second, when compared to other CSPs, the CSPs described herein do not require any wirebonding and do not require any internal leads.

A third feature is that the CSPs can accommodate a larger die size for a given package size. Some conventional CSP containing diodes can be limited to sizes of 0.6×1.0×0.4 mm with a die size of 300×300 μm. But the CSPs described herein can have a package size of about 0.55×about 0.75×about 0.4 mm and yet still contain a die with dimensions of about 350×350 μm.

A fourth feature is that the CSPs described herein can have a smaller footprint for the same device rating as some comparable CSPs. Some conventional CSPs containing a 1 A 40V schottky rectifier have a footprint of 1.25×2.5 mm. A comparable CSP manufactured as described above with a similar discrete device can have a footprint of about 1.25×about 1.5 mm.

A fifth features results from the larger contact area between the interconnect structure and the bond pads as well as the larger contact area between the DAP and the backside of the die. Both larger contact areas provide the semiconductor packages with better thermal performed when compared to some CSPs.

The CSPs can also be used in a wide array of low voltage, ultra-portable electronic devices. Examples of such electronic devices include handheld devices (such as PDAs), mobile mini-computers, disk drives, and cellular phones.

In addition to any previously indicated modification, numerous other variations and alternative arrangements may be devised by those skilled in the art without departing from the spirit and scope of this description, and appended claims are intended to cover such modifications and arrangements. Thus, while the information has been described above with particularity and detail in connection with what is presently deemed to be the most practical and preferred aspects, it will be apparent to those of ordinary skill in the art that numerous modifications, including, but not limited to, form, function, manner of operation and use may be made without departing from the principles and concepts set forth herein. Also, as used herein, examples are meant to be illustrative only and should not be construed to be limiting in any manner.

The invention claimed is:

1. A chip scale semiconductor package, comprising:
   a leadframe containing a die attach pad and a topset feature containing a standoff;
   a die containing a discrete device disposed on the die attach pad, the die having a height substantially similar to the standoff;
   a bond pad disposed on the discrete device;
   a connector structure disposed on the bond pad, the upper surface of the connector structure being a land pad and the connector structure comprising a first portion contacting the standoff and a second portion contacting the die; and
   a molding material encapsulating the leadframe, the die, the bond pad, and the connector structure while leaving an upper surface of the connector structure exposed.

2. The semiconductor package of claim 1, wherein the land pad comprises terminals for the package to connect to a printed circuit board.

3. The semiconductor package of claim 1, wherein the discrete device comprises a small signal diode, a schottky diode, rectifier, zener diode, TVS diode, or a bipolar transistor.

4. The semiconductor package of claim 1, wherein the the molding material does not encapsulate a portion of the connector structure on a side of the package.

5. The semiconductor package of claim 1, wherein the package does not comprise wirebonding or internal leads.

6. The semiconductor package of claim 1, wherein leadframe comprises an etched portion on an edge.

7. The semiconductor package of claim 1, wherein a conductive adhesive is located between the bond pad and the connector structure.

8. The semiconductor package of claim 1, wherein the connector structure connects the die attach pad and the land pad through the topset feature.

9. An electronic device containing a chip scale semiconductor package comprising:
- a leadframe containing a die attach pad and a topset feature containing a standoff;
- a die containing a discrete device disposed on the die attach pad, the die having a height substantially similar to the standoff;
- a bond pad disposed on the discrete device;
- a connector structure disposed on the bond pad, the upper surface of the connector structure being a land pad and the connector structure comprising a first portion contacting the standoff and a second portion contacting the die; and
- a molding material encapsulating the leadframe, the die, the bond pad, and the connector structure while leaving an upper surface of the connector structure exposed.

10. The device of claim 9, wherein the discrete device comprises a small signal diode, a schottky diode, rectifier, zener diode, a TVS diode, or a bipolar transistor.

11. The device of claim 9, wherein the package does not comprise wirebonding or internal leads.

12. The device of claim 9, wherein the leadframe comprises an etched portion on an edge.

13. The device of claim 9, wherein the connector structure connects the die attach pad and the land pad through the topset feature.

14. A method for making a chip scale semiconductor package, comprising:
- providing a leadframe with an array of panels, each panel containing a die attach pad and a topset feature containing a standoff;
- providing a semiconductor wafer with a plurality of discrete devices;
- separating the wafer into a plurality of dies, wherein each die contains a discrete device;
- attaching the dies to the die attach pads of the leadframe;
- forming bond pads on the discrete devices;
- attaching a connector structure to the bond pads and the topset feature, the connector structure containing a first portion contacting the standoff and a second portion contacting the die; and
- encapsulating a molding material around the leadframe, the die, the bond pad, and the connector structure while leaving an upper surface of the connector structure exposed.

15. The method of claim 14, wherein the upper surface of the connector structures forms a land pad array.

16. The method of claim 14, wherein the discrete devices comprise a small signal diode, a schottky diode, rectifier, zener diode, TVS diode, or a bipolar transistor.

17. The method of claim 14, wherein the molding material does not encapsulate a portion of the connector structure on a side of the package.

18. The method of claim 14, wherein the package does not comprise wirebonding or internal leads.

19. The method of claim 14, wherein the leadframe comprises an etched portion on an edge of each panel.

20. The method of claim 14, wherein the connector structure connects the die attach pad and the land pad through the topset feature.

21. A chip scale semiconductor package manufactured by the method comprising:
- providing a leadframe with an array of panels, each panel containing a die attach pad and a topset feature containing a standoff;
- providing a semiconductor wafer with a plurality of discrete devices;
- separating the wafer into a plurality of dies, wherein each die contains a discrete device;
- attaching the dies to the die attach pads of the leadframe;
- forming bond pads on the discrete devices;
- attaching a connector structure to the bond pads and the topset feature, the connector structure containing a first portion contacting the standoff and a second portion contacting the die;
- encapsulating a molding material around the leadframe, the die, the bond pad, and the connector structure while leaving an upper surface of the connector structure exposed; and
- singulating the molded structure into a plurality of semiconductor packages.

22. The package of claim 21, wherein the upper surface of the connector structures forms a land pad array.

23. The package of claim 21, wherein the package does not comprise wirebonding or internal leads.

24. The package of claim 21, wherein the leadframe comprises an etched portion on an edge of each panel.

25. The package of claim 21, wherein the connector structure connects the die attach pad and the land pad through the topset feature.

* * * * *